United States Patent [19]

Lee

[11] Patent Number: 5,250,774
[45] Date of Patent: Oct. 5, 1993

[54] POWER SUPPLY CIRCUIT FOR DRIVING MAGNETRON

[75] Inventor: Kyong-Keun Lee, Suwon, Rep. of Korea

[73] Assignee: Samsung Electronics Co., Ltd., Suweon City, Rep. of Korea

[21] Appl. No.: 899,360

[22] Filed: Jun. 16, 1992

[30] Foreign Application Priority Data

Jun. 28, 1991 [KR] Rep. of Korea ............... 91-10970

[51] Int. Cl.$^5$ ............................................ H05B 6/68
[52] U.S. Cl. .................. 219/10.55 B; 219/10.55 F; 219/10.55 R; 219/10.55 M; 363/41; 363/47; 363/71; 315/102
[58] Field of Search ............ 219/10.55 R, 10.55 M, 219/10.55 B, 10.55 F; 363/41, 47, 71, 75; 331/87; 315/102, 39.51

[56] References Cited

U.S. PATENT DOCUMENTS

| | | | |
|---|---|---|---|
| 4,868,509 | 9/1989 | Ury et al. | 219/10.55 B |
| 4,885,445 | 12/1989 | Taniguchi | 219/10.55 B |
| 4,885,506 | 12/1989 | Nilssen | 315/102 |
| 4,886,951 | 12/1989 | Matsumoto et al. | 219/10.55 B |
| 4,900,885 | 2/1990 | Inumada | 219/10.55 B |
| 4,933,830 | 6/1990 | Sato et al. | 219/10.55 B |
| 4,962,292 | 10/1990 | Aoki | 219/10.55 B |
| 4,977,301 | 12/1990 | Maehara et al. | 219/10.55 B |
| 5,012,058 | 4/1991 | Smith, deceased | 219/10.55 B |
| 5,053,682 | 10/1991 | Shoda et al. | 219/10.55 B |
| 5,082,998 | 1/1992 | Yoshioka | 219/10.55 B |
| 5,122,946 | 6/1992 | Taylor | 219/10.55 B |

FOREIGN PATENT DOCUMENTS 53-27143  3/1978  Japan .
2-135690  5/1990  Japan .

*Primary Examiner*—Bruce A. Reynolds
*Assistant Examiner*—Tu Hoang
*Attorney, Agent, or Firm*—Burns, Doane, Swecker & Mathis

[57] ABSTRACT

A power supply circuit for driving a magnetron equipped in a microwave oven, provides a stable power to the magnetron by preventing instability of output voltage due to LC resonance between a high voltage condenser (HVC) for driving a secondary winding of a transformer and the magnetron, and by good insulation between the secondary windings of the transformer in a switching mode power supply employing pulse width modulation.

10 Claims, 1 Drawing Sheet

POWER SUPPLY CIRCUIT FOR DRIVING MAGNETRON

BACKGROUND OF THE INVENTION

1. Field of the invention

The present invention relates to a microwave oven, more particularly to a power supply circuit for driving a magnetron equipped in a microwave oven, which provides stable power to the magnetron by preventing instability of outputs voltage due to LC resonance between a high voltage condenser (HVC) for driving the magnetron and a secondary winding of a transformer, and by attaining a good insulation between the secondary windings of the transformer in a switching mode power supply employed with a pulse width modulation.

2. Description of the Prior Art

In general, high voltage is required to drive a magnetron equipped in a microwave oven. A conventional power supply producing such a high voltage drives the magnetron by the high voltage induced to a secondary side by switching intermittingly a primary current.

According to the conventional power supply, if a cut-off period of the primary current is varied, the voltage for driving the magnetron is changed, thereby, allowing the output of the magnetron to be controlled appropriately.

Such a technique is disclosed in Japanese Patent Laid-open publication No. Sho 53-27143 (MAGNETRON DRIVING POWER SUPPLY) and Japanese Patent Laid-Open No. Hei 2-135690 (MICROWAVE OVEN).

A magnetron driving power supply according to the Japanese Patent Laid-open publication No. Sho 53-27143 is composed of a low frequency oscillator enabling change of the duty cycle of an output signal, a high frequency oscillator for controlling a signal transmission or signal oscillation by using the output signal from the low frequency oscillator, and a switching circuit for switching a direct current applied to a primary side of an output transformer of which a secondary side is connected to the magnetron, thereby obtaining a stable output on the basis of the input voltage.

In a microwave oven disclosed in Japanese Patent Laid-open publication No. Hei 2-135690, an output voltage is not varied with the frequency change of commercial power by intermitting a primary current of a transformer in accordance with each phase of the different frequencies of the commercial power to constantly ensure an output level of a magnetron.

With the construction as described above, however, a HVC must be used when generating high voltage by using a high voltage transformer (HVT). The magnetron will be damaged by the instability of output voltage of the HVT due to, LC resonance between the HVC and a secondary winding of the HVT connected to a magnetron. Further, there is a problem that a microwave oven is likely to be damaged by an unstable power supply voltage, applied to the magnetron, causing the destruction of insulation between winding coils of the transformer by the high voltage at a secondary side of the transformer.

SUMMARY OF THE INVENTION

Accordingly, it is an object of the present invention to provide a power supply circuit for driving a magnetron, capable of keeping a magnetron from being damaged by a high voltage by preventing LC resonance between a HVC and a secondary winding of HVT connected to a magnetron, and supplying a stable power supply voltage to the magnetron.

It is another object of the present invention to provide a power supply circuit for driving a magnetron in which a plurality of ribs are formed on an output bobbin wound with a secondary winding of a transformer with a high voltage to improve insulation between the windings, thereby preventing a microwave oven from being damaged.

To achieve the above objects, a power supply circuit for driving a magnetron is provided comprising an LC resonance preventing diode connected between a secondary winding of a transformer for driving the magnetron and a high voltage condenser for driving the magnetron, the output voltage of the transformer being exchangeably induced depending on a feedback voltage, whereby a stable power supply voltage is provided to the magnetron.

In an aspect of the present invention a plurality of ribs are arranged on an outer peripheral portion of an output bobbin of the transformer at regular intervals for improving insulation between secondary windings of the transformer, thereby preventing the power supply voltage from being unstable due to insulation breakdown.

The above and other objects, features and advantages will be apparent from the following description taken with reference to the accompanying drawings.

DETAILED DESCRIPTION OF THE PREFERRED EMBODIMENT

A power supply for driving a magnetron according to the present invention is constructed so that, when a voltage is inversely induced to a secondary coil of a transformer, LC resonance is prevented by using a diode connected between the secondary coil of the transformer, at which a magnetron driving voltage of the secondary coil is controlled depending on a feedback voltage, and a high voltage condenser or capacitor for driving magnetron.

Figure 1:
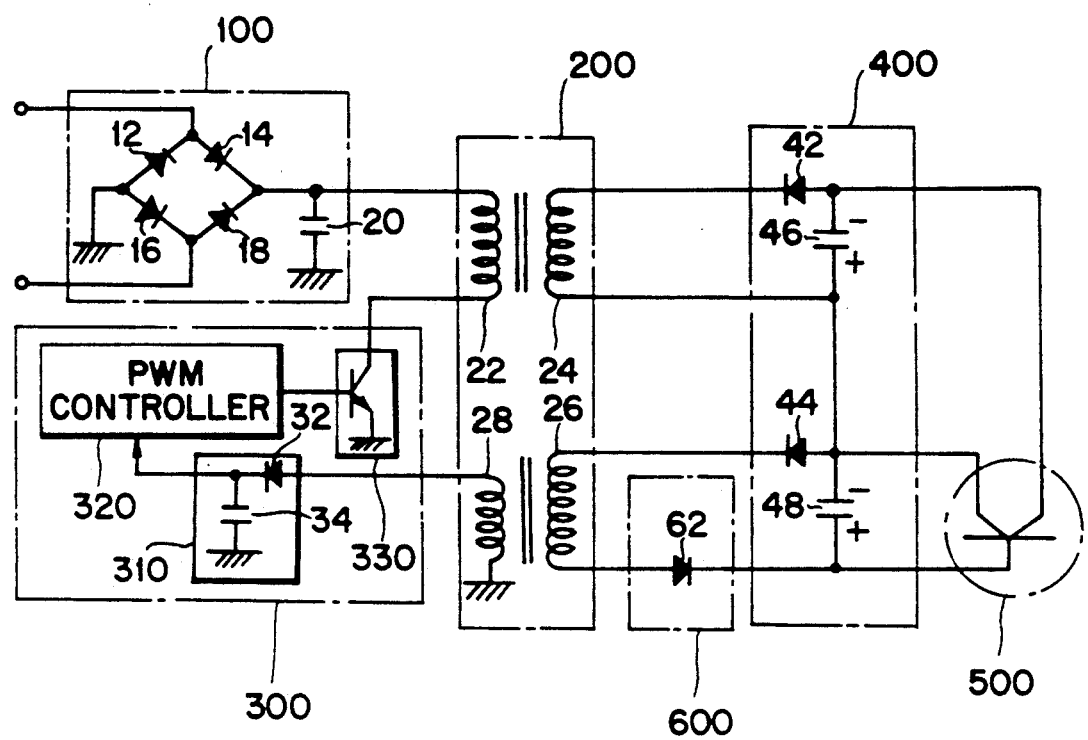
FIG. 1 is a circuit diagram of a power supply circuit for driving a magnetron according to a preferred embodiment of the present invention; and, FIG. 2 is a view illustrating a sectional structure of a transformer in FIG. 1.

FIG. 1 is a circuit diagram of a power supply for driving a magnetron according to the present invention.

In FIG. 1, reference numeral 100 denotes a first rectifier means which has bridge diodes 12, 14, 16 and 18 and a capacitor 20 for rectifying and outputting an external input commercial power supply, voltage for example, an ac voltage of 90 to 260 volts into a dc power supply voltage.

Reference numeral 200 denotes the transformer having a first winding 22 and secondary windings 24, 26 and 28. The transformer 200 receives at the first winding 22 the dc power supply voltage outputted from the first rectifier 100 and, hence, at the secondary windings 24, 26 and 28 thereof, an output voltage is induced switching operations thereof.

Moreover, reference numeral 300 denotes a voltage control means including a voltage feedback portion 310, a PWM control portion 320 and a switching portion 330. The voltage control means outputs a pulse signal having a differential switching period on the basis of the feedback voltage induced and fed from the secondary winding 28 of the transformer 200 to control a voltage induced so the secondary side of the transformer 200.

A second rectifier means 400 comprises a plurality of diodes 42 and 44 and capacitors 46 and 48, and multiplies and rectifies the voltage induced to the secondary windings 24 and 26 of the transformer 200. The voltage thus multiplied and rectified by the second rectifier 400 is applied to a magnetron 500. The voltage induced to the secondary winding 24 can be employed as a voltage for heating the magnetron 500 while the voltage induced to the winding 26 can be employed as a voltage for driving the magnetron 500.

An LC resonance preventing means 600 is composed of a diode 62, and prevents LC resonance between the high voltage condenser 48 of the second rectifier 400 and the secondary winding 26 of the transformer 200. The diode 62 is connected at an anode to the secondary winding 26 of the transformer 200 and connected at a cathode to a terminal "+" of the high voltage condenser 48 to prevent LC resonance current there between.

Accordingly, if the power supply voltage is outwardly inputted to the first rectifier 100 of the power supply according to the present invention as shown in FIG. 1, the input voltage is full-rectified by bridge diodes 12, 14, 16 and 18. The input voltage thus rectified is then smoothed by the capacitor 20.

As described above, the dc power supply voltage full-rectified and smoothed by the first rectifier 100, is supplied to the primary winding 22 of the transformer 200. At this time, a transistor of the switching portion 330 is repeatedly turned ON or OFF according to the pulse signal from the PWM control portion 320 of the voltage control means 300 so that a current switchingly flows through the primary winding 22 of the transformer 200. If the current flows through the primary winding 22 of the transformer 200 in accordance with the switching operation of the switching portion 330, then the voltage is induced to the secondary winding 24 and 26 of the transformer 200, and the induced voltage is supplied to the second rectifier 400 which half-rectifies and smoothes the input voltage by using the diodes 42 and 44 and the capacitors 46 and 48 to obtain the dc voltage.

The dc voltage obtained is input to the magnetron 500. As a result, the magnetron 500 is driven by the dc voltage.

At this time, if the voltage supplied to the magnetron 500 is changed due to the change of the power supply voltage during the operation of the magnetron 500, then the voltage induced to the secondary winding 28 of the transformer 200 is also changed. Therefore, the voltage induced to the winding 28 is propostional to the change of the voltage for driving the magnetron 500. The voltage is input to the voltage feedback portion 310 of the voltage control means 300. Consequently, the voltage feedback to the voltage feedback portion 310 is half-rectified by the diode 32 and capacitor 34 and the rectified voltage is supplied to the PWM control portion 320. Accordingly, when the feedback voltage is input to the PWM control portion 320 from the voltage feedback portion 310, the PWM control portion 320 produces pulse signals having a differential period of time on the basis of the level of the input voltage to control the switching period of the switching portion 330 for controlling the output voltage thereof.

In an operation of stabilizing the output voltage by using the voltage feedback portion 310, the diode 62 serving as the LC resonance preventing means 600 cuts off the current flowing toward the secondary winding 26 of the transformer 200 from the capacitor 48 in the second rectifier 400. As a result, the LC resonance between the secondary winding 26 of the transformer 200 and the capacitor 48 of the second rectifier 400 can be effectively prevented.

Now, an operation of preventing the LC resonance will be described in detail.

In FIG. 1, if the transistor of the switching portion 330 is turned ON corresponding to the output pulse of the PWM control portion 320, then a current flows through the primary winding 22 of the transformer 200, and the voltage is induced to the secondary windings 24 and 26 of the transformer 200. At this time, the voltage induced to the winding 26 is inversely induced to the diode 62 which serves as the LC resonance preventing means 600 so that no current flows through the winding 26. In other words, although a current flows through the primary winding 22 of the transformer 200, a voltage is inversely induced against the diode 62 forming the LC resonance preventing means 600 and, consequently, no current flows through the secondary winding 26. As a result, the LC resonance can be prevented between the winding 26 and the capacitor 48, thereby preventing the LC resonance current from affecting the secondary winding 26 of the transformer 200.

Meanwhile, if the transistor of the switching portion 330 is turned OFF corresponding to the output pulse of the PWM control portion 320, then current flows through the primary winding 22 of the transformer 200 while an inverse electromotive force is formed at the secondary winding 26 whereby a voltage is induced in a forward direction of the diode 62. Consequently, the voltage induced to the secondary windings 24 and 26 is supplied to drive the magnetron 500. Herein, if the diode 62 is not employed in the circuit arrangement described above, a higher voltage is produced at the secondary winding 26 due to a high voltage applied from the capacitor 48, and LC resonance is likely between the winding 26 and the capacitor 48. Upon the high voltage occurring at the secondary winding 26 and the LC resonance, the voltage inputted to the magnetron 500 is likely to be unstable. By this reason, the feedback voltage induced to the secondary winding 28 is unstable and an entire output voltage is also unstable.

Meanwhile, if the transformer 200 inputs at its primary winding 22 the dc voltage 100 of to 400 volts, then a high voltage above 8 K volts is likely to be induced to the secondary winding 26. Therefore, according to an aspect of the present invention, a plurality of ribs are arranged on an outer peripheral portion of an output bobbin wound with the secondary windings 24, 26 and 28 at regular intervals to insulate the windings. Further, a cylindrical hole is formed on an inner side of the output bobbin to accommodate an input bobbin wound with the primary winding 22. In the structure, the primary and secondary windings 22, 24, 26 and 28 are closely disposed as much as possible to enhance a mutual coupling coefficient.

Figure 2:
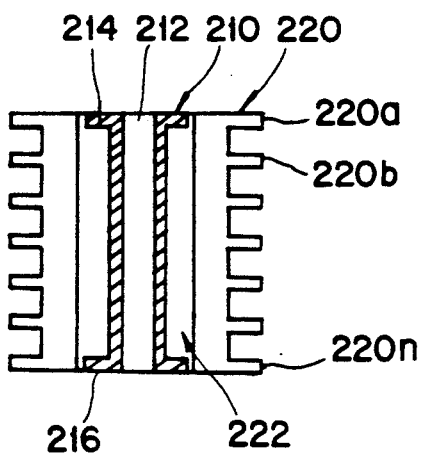

Referring now to FIG. 2, there is shown a sectional view of the transformer 200 having the structure described above. In the drawings, 210 denotes the input bobbin wound with the primary winding 22, and 220 denotes the output bobbing wound with the secondary windings 24, 26 and 28.

According to the transformer shown in FIG. 2, the cylindrical hole 212 is formed on the inner central portion of the circle-shaped input bobbin 210 for accommodating a ferride core (not shown). At the opposing sides of the input bobbin, side walls 214 and 216 are formed to permit the primary winding 22 to be wound on the outer peripheral portion of the input bobbin.

Meanwhile, a hole 222 is formed at an inner central portion of the output bobbin 220 of circle shape. At an external periphery of the output bobbin 220, a plurality of ribs 220a to 220n are formed at regular intervals according to the voltages of the secondary winding 24, 26 and 28 for providing good insulation between the windings.

In this case, the input bobbin 210 and the output bobbin 220 are closely contacted to increase a mutual coupling coefficient.

Although, the present invention has been described with reference to the specified embodiment, it would be apparent to those skilled in the art that various changes and modifications may be made therein without departing from the spirit and scope of the invention. Particularly, the specification has been described in consideration of the power supply circuit of the microwave oven. But, the invention will be applied to that of an induction cooker or an apparatus using a high voltage as a driving power supply voltage.

What is claimed is:

1. A power supply circuit for driving a magnetron comprising:

a transformer having a magnetron driving secondary winding;

a high voltage condenser for driving the magnetron; and an LC resonance preventing diode connected between a terminal of the magnetron driving secondary winding of said transformer and a terminal of the high voltage condenser, an output voltage of the magnetron driving secondary winding of the transformer being exchangeably induced depending on a feedback voltage, to provide a stable power supply voltage to the magnetron.

2. A power supply circuit for driving a magnetron according to claim 1, wherein said LC resonance preventing diode is connected at an anode to the magnetron driving secondary winding of the transformer and connected at a cathode to a positive terminal of the high voltage condenser.

3. A power supply circuit for driving a magnetron according to claim 1, wherein said transformer comprises an output bobbin having a plurality of ribs formed at regular intervals on an external periphery thereof and an input bobbin inserted in an internal central portion of the output bobbin.

4. A power supply circuit for driving a magnetron according to claim 3, wherein said ribs are disposed at a predetermined distance according to the magnetron driving secondary winding of the transformer and formed on the external periphery of the output bobbin.

5. A power supply circuit for driving a magnetron comprising:

first rectifier means for rectifying an input power voltage into a dc power voltage;

a transformer for inducing the dc voltage from a primary winding to secondary windings by a switching operation thereof, said secondary windings including a feedback secondary winding and a magnetron driving secondary winding;

voltage control means for outputting a pulse signal having a differential period according to the voltage induced and fed from the feedback secondary winding to control the voltage to be induced to the secondary windings;

second rectifier means for rectifying and outputting the voltage induced to the magnetron driving secondary winding; and LC resonance preventing means for removing LC resonance between a high voltage condenser of the second rectifier means and the magnetron driving secondary winding of the transformer.

6. A power supply circuit for driving a magnetron according to claim 5, wherein said LC resonance preventing means comprises a diode for blocking a current flowing toward the magnetron driving secondary winding of the transformer from the high voltage condenser when an inverse voltage is induced to the transformer.

7. A power supply circuit for driving a magnetron according to claim 5, wherein said transformer comprises an output bobbin having a plurality of ribs formed at regular intervals on an external periphery thereof and an input bobbin inserted in an internal central portion of the output bobbin.

8. A power supply circuit for driving a magnetron according to claim 7, wherein said ribs are disposed at a predetermined distance according to the magnetron driving secondary winding of the transformer.

9. A power supply circuit for driving a magnetron comprising:

first rectifier means connected to an AC voltage source for outputting a first rectified voltage;

a transformer having a primary winding and a secondary winding outputting an induced AC voltage, wherein a first terminal of the primary winding is connected to an output of the first rectifier means;

voltage control means for controlling the rate of a pulsed DC current through the primary winding of the transformer according to the induced AC voltage, the voltage control means including a voltage feedback portion connection across the secondary winding for outputting a rectified feedback voltage, a pulse width modulation control portion for modulating a pulse width of pulses according to the rectified feedback voltage, and a switching portion connected to a second terminal of the primary winding for controlling on and off operation of the primary winding based on the modulated pulses outputted to the pulse width modulation control portion;

second rectifier means for rectifying the induced AC voltage to a second rectified voltage outputted to the magnetron, the second rectifier means including a first diode and a condenser, the condenser having a negative terminal connected to a first terminal of the secondary winding through the first diode and a positive terminal connected to an anode of the magnetron; and LC resonance preventing means for preventing an occurrence of LC resonance between the secondary winding and the condenser, the LC resonance preventing means including a second diode having an anode connected to the second terminal of the secondary winding and a cathode connected to the positive terminal of the condenser, whereby the LC resonance preventing means suppresses an induction of high voltage at the voltage control means resulting from LC resonance in the secondary winding.

10. A power supply circuit for driving a magnetron according to claim 9, wherein said transformer further comprises:

an output bobbin having a penetrating hole formed therein and having a plurality of ribs regularly spaced along an outer periphery of said output bobbin;

an input bobbin having a penetrating hole formed therein and having two side walls formed at upper and lower ends, respectively, of said input bobbin, so as to be mounted adjacent to an inner side of the output bobbin, wherein said input bobbin is inserted in said output bobbin.

* * * * *